United States Patent [19]

Maignan et al.

[11] Patent Number: 5,247,596
[45] Date of Patent: Sep. 21, 1993

[54] FIBER-OPTICS CONNECTED OPTOELECTRONIC DEVICE MOUNTED ON A SUBSTRATE AND METHOD OF MANUFACTURING IT

[75] Inventors: Michel Maignan, Marcoussis; Jean Ducate, L'Hay les Roses, both of France

[73] Assignee: Alcatel N.V., Amsterdam, Netherlands

[21] Appl. No.: 831,850

[22] Filed: Feb. 6, 1992

[30] Foreign Application Priority Data

Feb. 8, 1991 [FR] France ............................ 91 01469

[51] Int. Cl.$^5$ ............................................. G02B 6/42
[52] U.S. Cl. ........................................ 385/88; 385/91; 385/38
[58] Field of Search ..................... 385/88, 89, 90, 91, 385/38

[56] References Cited

U.S. PATENT DOCUMENTS

| | | | |
|---|---|---|---|
| 4,268,113 | 5/1981 | Noel, Jr. | 385/92 |
| 4,373,778 | 2/1983 | Adham | 385/91 X |
| 4,690,492 | 9/1987 | Beard | 350/96.20 |
| 4,778,241 | 10/1988 | Haltenorth | 385/91 |
| 5,101,465 | 3/1992 | Murphy | 385/88 |

FOREIGN PATENT DOCUMENTS 8701465  3/1987  PCT Int'l Appl. .

Primary Examiner—John D. Lee
Assistant Examiner—S. W. Barns
Attorney, Agent, or Firm—Robbins, Berliner & Carson

[57] ABSTRACT

The optical connection to a fiber-optics connected optoelectronic device mounted on a substrate is made by an optical fiber inserted in a hole through the substrate facing the component. The walls of the hole align and locate the fiber. The invention finds an application in the manufacture of a balanced optoelectronic receiver for a coherent detection fiber-optics transmission system.

8 Claims, 3 Drawing Sheets

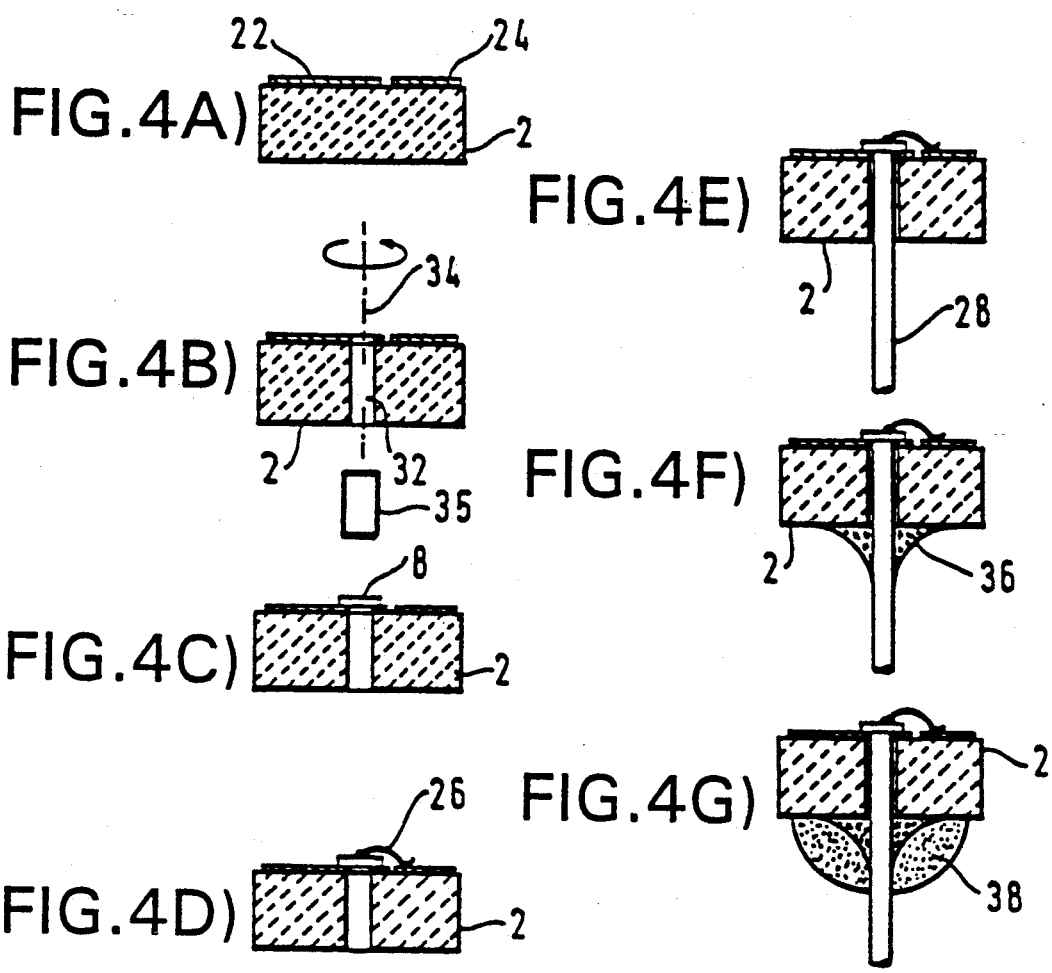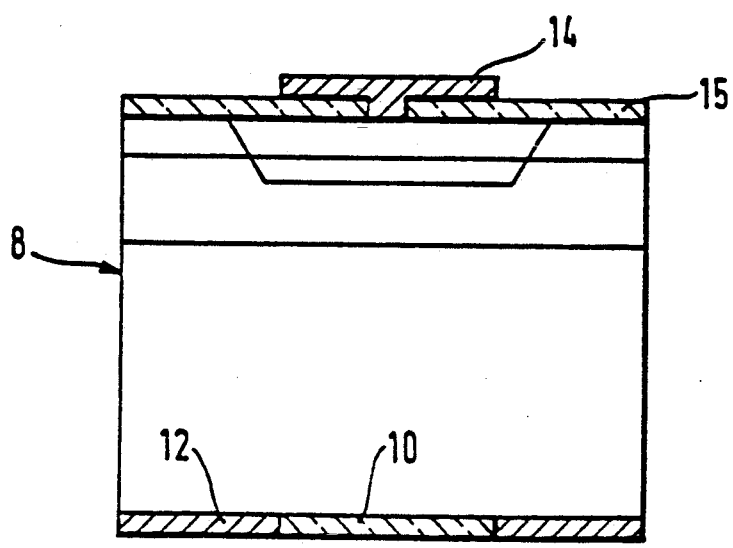

FIBER-OPTICS CONNECTED OPTOELECTRONIC DEVICE MOUNTED ON A SUBSTRATE AND METHOD OF MANUFACTURING IT

BACKGROUND OF THE INVENTION

1. Field of the invention

The present invention concerns a fiber-optics connected optoelectronic device mounted on a substrate. It finds an application in the manufacture of an optical receiver for a fiber-optics transmission system.

2. Description of the prior art

In a system of this kind a light wave carries a digital signal which is either intensity modulated and directly detected or frequency or phase modulated and coherently detected. In the case of a high bit rate, signal detection relies on devices operating in the microwave frequency range (1.8 GHz, for example) and these devices are advantageously integrated into a hybrid circuit on a ceramic substrate.

In a receiver of this kind an input light signal is guided by an optical fiber onto a photodiode connected to a first amplifier of the receiver. The electrical interconnection of these two devices is a difficult technical problem when the frequency of the electrical signal is high: the spurious capacitance of the connection line imposes a limitation on the bandwidth of the receiver and introduces additional noise. Furthermore, if the distance to the photodiode is increased the impedance mismatch between the photodiode and the amplifier causes standing waves to appear on the line and these disrupt the operation of the circuit. Various proposals have been made for solving this problem; they all involve eliminating the casing in which the photodiode is conventionally contained and providing a direct electrical connection from the photodiode to the amplifier in order to eliminate the spurious capacitance of the casing. Holding the optical fiber in a position ensuring a good optical connection then becomes a problem and is made more complex if the device must be designed to withstand mechanical stresses. One solution to this optical connection problem is described in the document WO-A-87/01465 - BRITISH TELECOMMUNICATIONS (which corresponds to U.S. Pat. No. 4,830,450). The optical fiber 4 is held directly by the edges of an optical connection hole formed for this purpose in a ceramic substrate 1 using a laser. However, according to this document a hole drilled by a laser in a ceramic substrate has a conical shape which makes it impossible to align the optical fiber correctly. For this reason the substrate is made by stacking a plurality of ceramic platelets through each of which a conical hole has been drilled. These holes are aligned and the cones are oriented in the direction which facilitates insertion of the fiber. This embodiment of an optical connection is complex and costly.

The present invention is directed to solving these connection problems in a simpler way.

Although consideration is given above to problems associated with implementing an optical receiver by means of a photodiode, it must be understood that the present invention also applies to the implementation of devices other than an optical receiver of this kind and to the connection of optoelectronic components other than a photodiode of this kind, for example a phototransistor, an optically controlled microwave component or a semiconductor laser, when these components are carried by ceramic substrates.

In all these various situations a general objective of the invention is the simple implementation of a durably accurate optical connection on a ceramic substrate such as that of a hybrid circuit.

SUMMARY OF THE INVENTION

In a first aspect, the present invention consists in a fiber-optics connected optoelectronic device mounted on a substrate in which the electrical connection of an optoelectronic component fixed to a ceramic substrate is provided by contact of said component with at least one conductive track and the optical connection of said component is provided by an optical fiber held in an optical connection hole through said substrate which has a substantially continuous cylindrical wall whose diameter is matched to that of said optical fiber so that said wall aligns and locates said optical fiber.

In a second aspect, the present invention consists in a method of manufacturing a fiber-optics connected optoelectronic device mounted on a substrate comprising the following operations:

- placing on a top surface of a ceramic substrate a set of electronic components comprising at least one optoelectronic component having an optical connection region,
- fixing said set of components to said surface,
- making electrical connections for said set of components,
- drilling an optical connection hole along a drilling axis through said substrate facing said optical connection region of said optoelectronic component using a focussed laser beam,
- rotating said substrate about said drilling axis during said drilling operation so as to confer upon the wall of said optical connection hole the shape of a cylinder of revolution about said axis and so that the diameter of said hole is matched to an outside diameter of an optical fiber,
- inserting an end section of said optical fiber in said optical connection hole, and
- fixing said fiber to said substrate to make an optical connection to said optoelectronic component.

The implementation of the present invention will now be described by way of non-limiting example only and with reference to the accompanying diagrammatic drawings. If the same item is shown in more than one figure it is always identified by the same reference symbol.

BRIEF DESCRIPTION OF THE DRAWINGS

FIGS. 4A, 4B, 4C, 4D, 4E, 4F, 4G are plan views of this circuit to a reduced scale at successive stages in its manufacture.

FIG. 5 is a view in cross-section and to an enlarged scale of a photodiode constituting an optoelectronic component of this circuit.

DETAILED DESCRIPTION OF THE INVENTION

Figure 1:
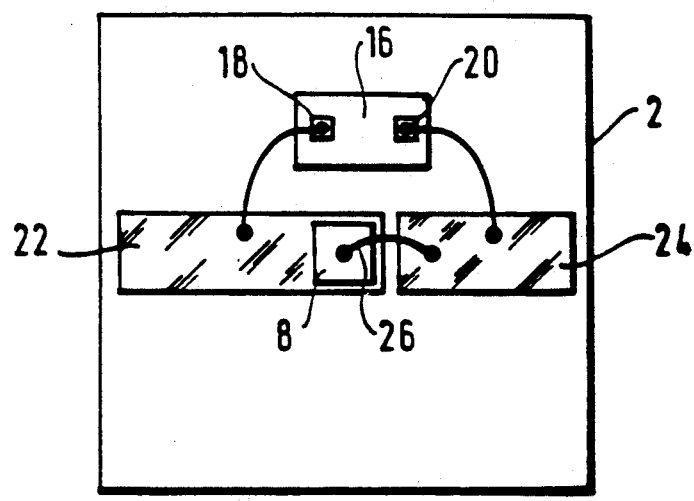
FIG. 1 is a plan view of a simplified hybrid circuit constituting a first device in accordance with the present invention.
Figure 2:
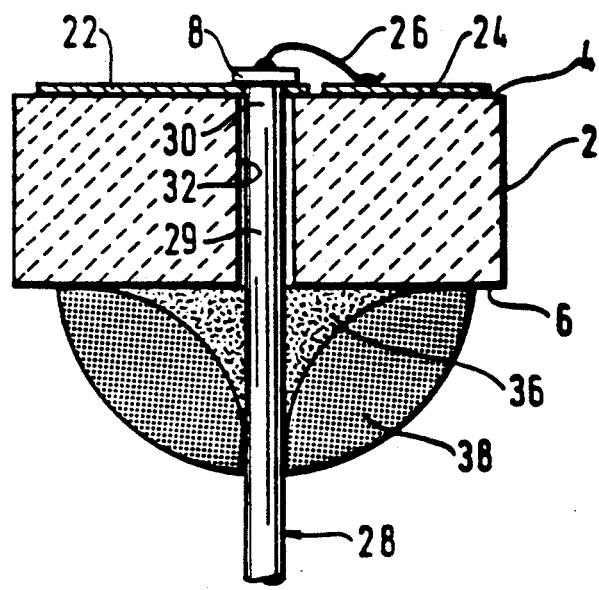
FIG. 2 is a view of this circuit in cross-section.
Figure 3:
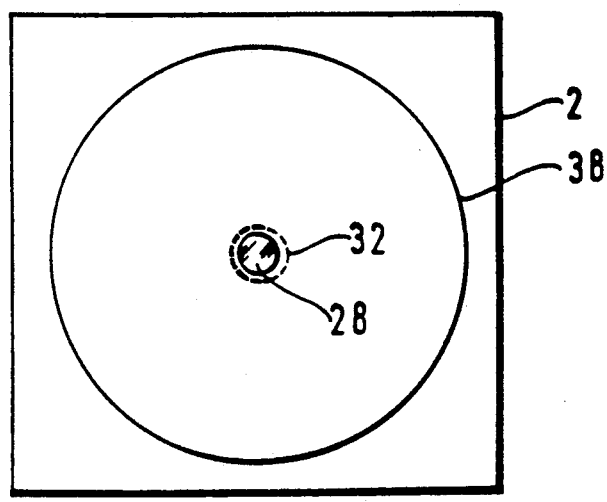
FIG. 3 is a bottom view of this circuit.

Certain features common to a device in accordance first be generally described with reference to FIGS. 1 through 3. Some information more specific to the invention will also be given by way of example.

With reference to these common features, an optoelectronic device is implemented in the form of a hybrid circuit and comprises:

- A ceramic substrate 2. This has two main surfaces, a top surface 4 and a bottom surface 6.

- A set of electronic components which have electrical connection terminals including at least one optoelectronic component 8. This has lower and upper electrical connecting terminals 12 and 14 (FIG. 5). It also has an optical connection region 10. Another electronic component 16 has two electrical connection terminals 18 and 20. All these components are fixed to the top surface 4 of the substrate 2.

- Connection lines connected to said terminals to make electrical connections required for the device to operate. Similar lines may also be used to connect the device to external components. They comprise tracks 22 and 24 fixed to the substrate and metal wires 26 soldered to said terminals and said tracks.

- An optical fiber 28 an end portion of which has a first end 30 facing the region 10 in order to make an optical connection required for the device to operate.

- Finally, fiber retaining means 32, 36 for holding said end portion in position relative to the substrate 2 to provide a permanent optical coupling between the optical fiber and the optoelectronic component even in the presence of mechanical forces due to impact or vibration. To this end, an optical connection hole 32 is drilled through the substrate 2 linking its two main surfaces 4 and 6. The optoelectronic component 8 is positioned on the top surface 4 of the substrate so that its optical connection region 10 faces the hole. The optical fiber 28 is underneath the substrate and has near its first end 30 an end section 29 inserted in the hole.

According to the present invention the optical connection hole 32 has a cylindrical surface of constant diameter matched to an outside diameter of the end section of the optical fiber 29 so that this section is aligned and located by the wall of this hole. This diameter is typically less than 0.2 mm.

The method of manufacturing a device of this kind will now be generally described with reference to FIGS. 4 and 5. The manufacturing process comprises a number of operations which are common to this process and prior art processes. These common operations are, not in chronological order:

- positioning on a top surface 4 of a substrate 2 a set of electronic components 8, 16 including at least one optoelectronic component 8 having an optical connection region 10,

- fixing this set of components to this surface,

- making electrical connections 22, 24, 26 for this set of components,

- positioning an end section 29 of an optical fiber 28 relative to the substrate 2 so that a first end 30 of the fiber faces the optical connection region 10 of the optoelectronic component 8, and

- fixing the fiber to the substrate to make an optical connection to the optoelectronic component.

According to the present invention, this process further comprises a drilling operation to drill an optical connection hole 32 through the substrate 2. The positioning operation 10 causes the optical connection region 10 of the optoelectronic component 8 to face the hole and the operation to position the end section 29 comprises the insertion of this section into the hole.

If the substrate 2 is made from ceramic the drilling operation is preferably carried out using a focussed laser beam. It forms the optical connection hole 32 along a drilling axis 34 which is perpendicular to the substrate, for example. It makes a hole whose diameter is matched to an outside diameter of the optical fiber 28. So that the wall of this wall is the shape of a cylinder of revolution, or nearly so, the substrate 2 is rotated about the drilling axis 34 during this operation.

The process will now be described in a more specific way in the situation where the optoelectronic component is a photodiode 8. This photodiode has its connection region 10 on a side which is usually called its "rear" side and which in this application becomes its bottom side. This region is surrounded (FIG. 5) by a bottom connection terminal 12. The other connection terminal 14 is formed on the top surface facing an opening formed in a dielectric layer 15. The operations relating to the other electronic component 16 are conventional and are not shown and will not be described.

In chronological order, the operations concerning the photodiode are:

- Choosing the location of the photodiode 8 on the substrate 2.

- Etching a metal layer deposited on said substrate to form the electrical connection tracks 22, 24 leading to the selected location for the photodiode (FIG. 4A).

- Drilling the hole 32 matched to the diameter of the optical fiber at the location selected for the photodiode at the end of the track 22. The hole is drilled by the beam of a laser 35 along the axis 34 while the substrate 2 is rotated about this axis (FIG. 4B).

- Positioning the photodiode 8 over the hole 32. The rear surface faces the hole. The photodiode is positioned by a component placement machine and fixed in position using a conductive adhesive. This makes a first connection by virtue of electrical contact between the bottom terminal 12 of the photodiode and the track 22 (FIG. 4C).

- Making a second connection to the front surface of the photodiode by a gold wire 26 which is soldered to its top terminal 14 and to the track 24 (FIG. 4D).

- Preparing the so-called pigtail optical fiber 28 by cutting its end 30 to an angle which minimizes optical reflections.

- Inserting the end section 29 of the fiber 28 into the hole 32 from the lower end of this hole until its end contacts the photodiode (FIG. 4E).

- Fixing the fiber by means of a droplet of hard adhesive 36 deposited on the bottom of the substrate 2 (FIG. 4F).

- Rendering the connection of the fiber 28 to the substrate 2 flexible by covering the droplet of hard adhesive 36 with a droplet of flexible polymer 38. The objective of this operation is to prevent the fiber breaking if it is bent by the user.

The alumina substrate 2 is 0.635 mm thick. The gold electrical connection tracks are etched by conventional methods.

The hole 32 through the substrate has a diameter of 0.14 mm. It is drilled using an excimer laser. During drilling the substrate is rotated to obtain an almost perfectly cylindrical hole.

The photodiode 8 is placed in position by a component placement machine. A suction device holds it while a carriage movable on three axes positions the substrate. Optical sighting through the hole assures the necessary accuracy of positioning. The photodiode is fixed in place using Epotecny H20E conductive adhesive. The adhesive is deposited beforehand on the track 22 at the edge of the hole 32 using a needle.

The second connection to the front surface of the photodiode is made by a thermocompression machine using a gold wire 26 which has a diameter of 0.018 mm.

The monomode fiber 28 has a diameter of 0.125 mm. Its core has a diameter of 8 μm. Its end 30 is polished to an angle of 6°. It is positioned over the hole and then lowered by a clamp which can move along three axes. Light can be injected into the fiber during this operation to monitor the quality of the optical coupling.

The adhesive of the droplet 6 is Epotecny E adhesive. It is deposited by means of a needle onto the bottom of the substrate in contact with the optical fiber.

The protection droplet 38 provides a flexible connection between the fiber and the substrate and is deposited by means of a needle. A suitable product is TECSIL 3020 sealing compound.

It is possible to obtain by this means a sensitivity exceeding 0.85 A/W and a bandwidth exceeding 2 GHz.

The information given above with a reference to a first hybrid circuit applies equally to a second more complicated hybrid circuit that will now be described with reference to FIG. 6. Generally speaking, this second circuit comprises:
- two semiconductor photodiodes 105 constituting two optoelectronic components,
- two optical connection holes (not shown) similar to the hole 32,
- two optical fibers (not shown) similar to the fiber 28 inserted into these two holes to make the respective optical connections to the two photodiodes, and
- at least one semiconductor microwave amplifier 106 constituting an electronic component and electrically connected to the two photodiodes to constitute with them a balanced optoelectronic receiver suitable for use in a coherent detection fiber-optics transmission network.

The optical fibers (not shown) are attached in the same way as the fiber 28.

Figure 6:
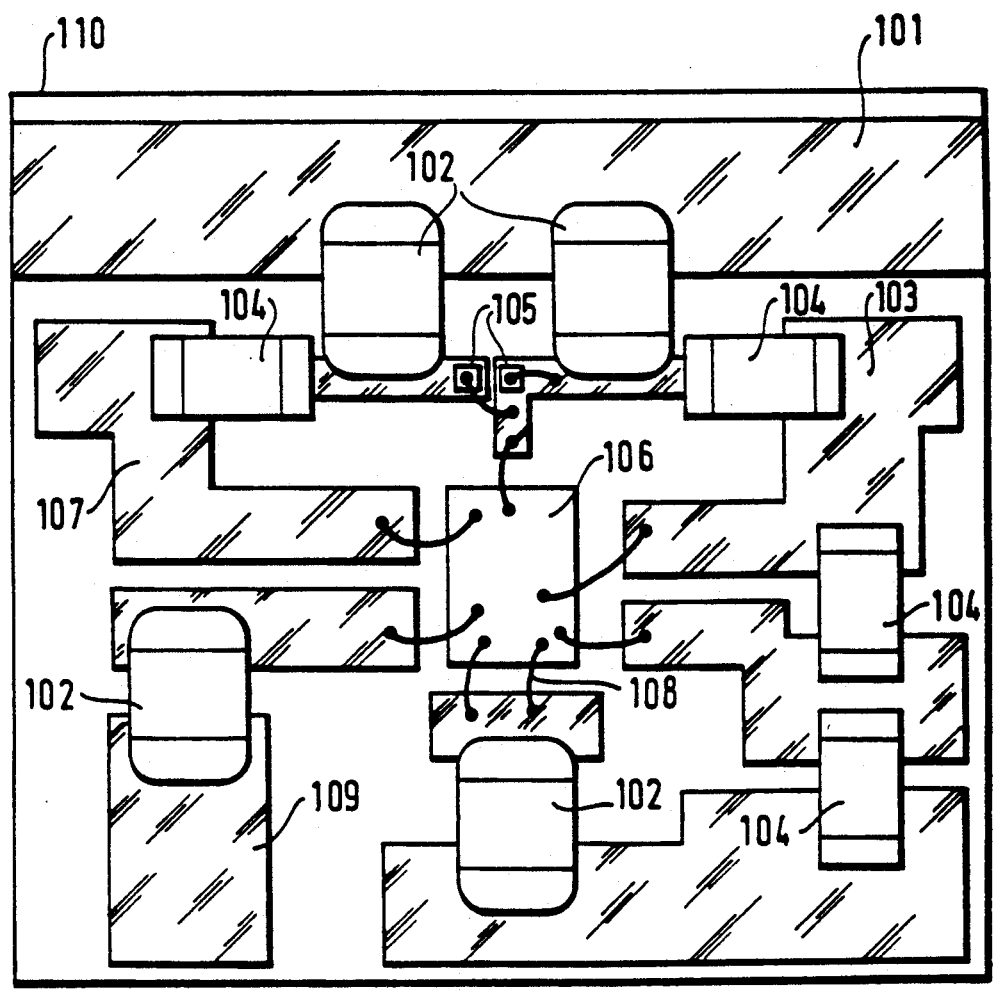
FIG. 6 is a plan view of a more complex hybrid circuit constituting a second device in accordance with the present invention.

In FIG. 6 the following reference numbers identify the following components:
101: Electrical ground track.
102: Decoupling capacitor.
103: Power supply track connected to the positive terminal of an external voltage source (not shown).
104: Bias resistors.
105: Two photodiodes identical to the photodiode 8 previously described and attached in the same way.
106: MMIC amplifier.
107: Power supply track connected to the negative terminal of said external voltage source.
108: Electrical connection wires identical to the wire 26 and soldered in the same way to the electrical connection terminals of the various components and/or the connecting tracks.
109: Signal output track connected to an external device (not shown).
110: Substrate identical to the substrate 2 previously described.

That is claimed:

1. Fiber-optics connected optoelectronic device mounted on a substrate in which the electrical connection of an optoelectronic component fixed to a ceramic substrate is provided by contact of said component with at least one conductive track and the optical connection of aid component is provided by an optical fiber held in an optical connection hole through said substrate which is defined by a substantially continuous cylindrical wall of said matched to that of said optical fiber so as to provide a slip fit between said optical fiber and said wall that aligns and locates said optical fiber.

2. Device according to claim 1 wherein said optical connection hole has a diameter less than 0.2 mm.

3. Device according to claim 2 wherein the difference between the diameter of said optical connection hole and the diameter of said optical fiber is not substantially greater than 15 microns.

4. Device according to claim 1 in the form of a hybrid circuit wherein said substrate carries a set of electronic components including at least one electronic component other than said optoelectronic component and a plurality of conductive tracks electrically interconnecting said components.

5. Method of manufacturing a fiber-optics connected optoelectronic device mounted on a substrate comprising the following operations:
placing on a top surface of a ceramic substrate a set of electronic components comprising at least one optoelectronic component having an optical connection region,
fixing said set of components to said surface,
making electrical connections for said set of components,
drilling an optical connection hole along a drilling axis through said substrate facing said optical connection region of aid optoelectronic component using a focussed laser beam,
rotating said substrate about said drilling axis during said drilling operation so as to confer upon the wall of said optical connection hole the shape of a cylinder of revolution about said axis and so that the diameter of said hole is matched to an outside diameter of an optical fiber,
inserting an end section of said optical fiber in said optical connection hole, and
connection to said optoelectronic component.

6. Method according to claim 5 wherein said optical connection hole provides a slip fit for said optical fiber.

7. Method according to claim 6 wherein the difference between the diameter of said optical connection hole and the diameter of said optical fiber is not substantially greater than 15 microns.

8. A balanced optoelectronic receiver adapted to be used in a coherent detection fiber-optics transmission network in the form of a hybrid circuit mounted on a ceramic substrate carrying a plurality of electronic components including at least one semiconductor microwave amplifier and at least two semiconductor photodiodes electrically interconnected to form the balanced optoelectronic receiver, wherein
electrical connection to each of said electronic components is provided by contact of said each component with one or more conductive tracks carried by a surface of said substrate, and
optical connection to each of said semiconductor diodes is provided by a respective optical fiber held in a respective optical connection hole through said substrate which has a substantially continuous cylindrical wall whose diameter is matched to that of said optical fiber so that said wall aligns and locates said optical fiber, each said optical connection hole having a diameter less than 0.2 mm.

* * * * *